(12) United States Patent
Kim

(10) Patent No.: US 11,373,779 B2
(45) Date of Patent: Jun. 28, 2022

(54) CONDUCTIVE PARTICLES AND TEST SOCKET HAVING THE SAME

(71) Applicant: SNOW CO., LTD., Siheung-si (KR)

(72) Inventor: Gyu Sun Kim, Yongin-si (KR)

(73) Assignee: SNOW CO., LTD., Siheung-si (KR)

(*) Notice: Subject to any disclaimer, the term of this patent is extended or adjusted under 35 U.S.C. 154(b) by 0 days.

(21) Appl. No.: 17/343,223

(22) Filed: Jun. 9, 2021

(65) Prior Publication Data

US 2021/0319928 A1 Oct. 14, 2021

Related U.S. Application Data

(63) Continuation of application No. PCT/KR2020/016252, filed on Nov. 18, 2020.

(30) Foreign Application Priority Data

Nov. 26, 2019 (KR) .................. 10-2019-0153264
Nov. 26, 2019 (KR) .................. 10-2019-0153265

(51) Int. Cl.
*H01B 5/00* (2006.01)
*G01R 1/04* (2006.01)
*H05K 1/09* (2006.01)

(52) U.S. Cl.
CPC ............. *H01B 5/00* (2013.01); *G01R 1/0408* (2013.01); *H05K 1/092* (2013.01); *H05K 2201/0314* (2013.01); *H05K 2201/0379* (2013.01)

(58) Field of Classification Search
CPC .......... H01B 5/00; G01R 1/0408; G01R 1/04; G01R 1/067; G01R 1/073; G01R 31/28; H05K 1/092; H05K 2201/0314; H05K 2201/0379; H05K 2201/0215;
(Continued)

(56) References Cited

U.S. PATENT DOCUMENTS

2014/0008104 A1* 1/2014 Sugaya .................. H05K 3/303
174/251
2015/0153387 A1* 6/2015 Lee ...................... G01R 1/0466
324/756.02
(Continued)

FOREIGN PATENT DOCUMENTS

KR 10-2005-0027251 A 3/2005
KR 10-2009-0071312 A 7/2009
KR 10-2010-0052956 A 5/2010
(Continued)

OTHER PUBLICATIONS

English Translation KR101739536B1, Published May 24, 2017 (Year: 2017).*

*Primary Examiner* — Steven T Sawyer
(74) *Attorney, Agent, or Firm* — Novick, Kim & Lee, PLLC; Jae Youn Kim

(57) ABSTRACT

Proposed is a conductive particle used for a testing socket electrically connecting a lead of a device to be tested and a pad of a test board by being arranged between the device to be tested and the test board, wherein the conductive particle has a predetermined depth d and has a length l that is greater than a width w, the conductive particle having a body part in a pillar shape, a first convex part having an upper surface, formed in a top of the body part, and a second convex part having a lower surface, formed in a bottom of the body part.

13 Claims, 8 Drawing Sheets

(58) Field of Classification Search
CPC ... H05K 2201/0245; H05K 2201/0248; H05K 2201/0263; H05K 2201/0272
See application file for complete search history.

(56) References Cited

U.S. PATENT DOCUMENTS

2017/0318668 A1* 11/2017 Yosui .................. H05K 3/4652
2022/0005626 A1* 1/2022 Oh ......................... H05K 3/10

FOREIGN PATENT DOCUMENTS

| KR | 10-2017-0005950 A | 1/2017 |
| KR | 10-1739536 B1 | 5/2017 |
| KR | 10-1739537 B1 | 5/2017 |
| KR | 10-1769882 B1 | 9/2017 |
| KR | 10-1782604 B1 | 9/2017 |
| KR | 10-2017-0127319 A | 11/2017 |
| KR | 10-1901982 B1 | 9/2018 |

* cited by examiner

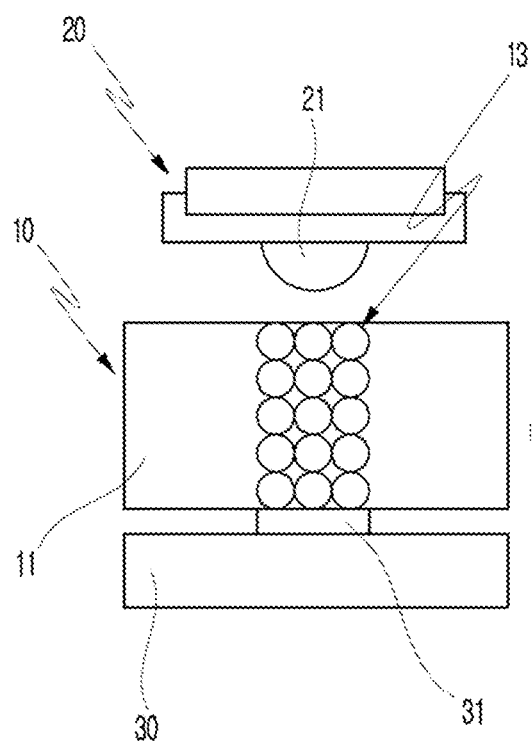
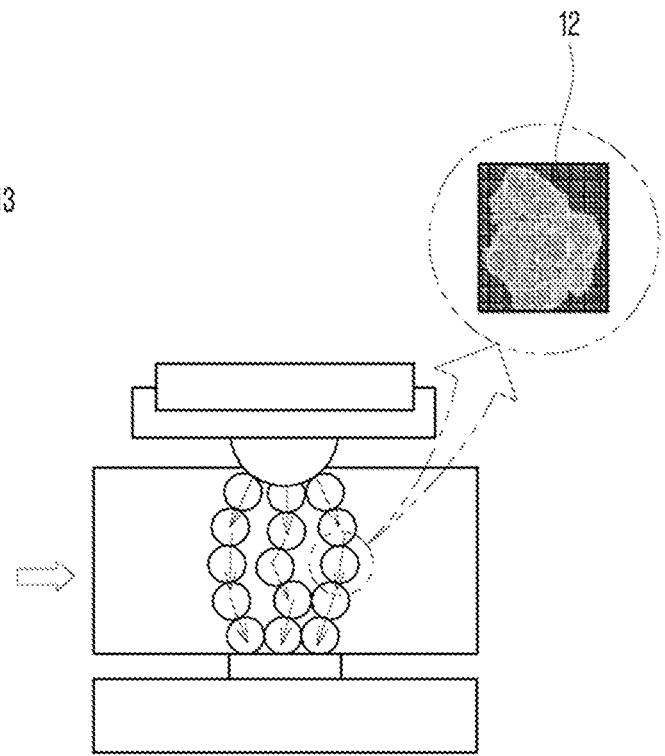
FIG. 1A
PRIOR ART
FIG. 1B
PRIOR ART about 68 particles of Ø 30μm    about 76 particles of 20μm X 40μm

CONDUCTIVE PARTICLES AND TEST SOCKET HAVING THE SAME

CROSS-REFERENCE TO RELATED APPLICATIONS

This application is a continuation of PCT/KR2020/016252 filed Nov. 18, 2020, which claims priority to KR 10-2019-0153264, filed Nov. 26, 2019 and KR 10-2019-0153265, filed Nov. 26, 2019, the entire disclosures of which are incorporated herein by references.

TECHNICAL FIELD

The present invention relates to a conductive particle and a testing socket having the same. More specifically, the present invention relates to a conductive particle used for a testing socket electrically connecting a lead of a device to be tested and a pad of a test board by being arranged between the device to be tested and the test board, and a testing socket having the same.

BACKGROUND ART

In general, when the manufacturing process of a device to be tested such as a semiconductor device is finished, it is necessary to run a test on the device to be tested. In other words, the device to be tested such as a semiconductor device which has been manufactured is subjected to an electric test in order to determine whether the device is defective. Specifically, a predetermined test signal is transmitted from a testing apparatus to the device to be tested to determine whether the device to be tested is defective.

Such testing sockets require a stable mechanical contact ability when individual devices to be tested move to their correct position and accurately and repeatedly contact the socket mounted on a test board, and a stable electrical contact ability to minimize signal distortion at the electrical contact point when transmitting signals.

At this time, the test board and the device to be tested are not directly connected to each other, but indirectly connected using an intermediate device such as a testing socket. Various types of testing sockets may be used such as pogo pins, etc., but recently, the use of testing sockets using elastic sheets with anisotropic properties is increasing due to technology changes in semiconductor devices.

FIG. 1A drawing illustrating contact between a lead of a device to be tested and a conductive portion according to prior art.

The testing socket 10 according to prior art is in a form in which a plurality of conductive particles 12 are contained in the substrate 11 made of an insulating elastic material. The plurality of conductive particles 12 are irregular spherical particles, which are oriented in the thickness direction to form one conductive portion 13, and the conductive portion 13 is arranged in the planar direction to correspond to a lead 21 of the device to be tested 20. Meanwhile, the conductive portion is insulatingly supported by an insulating support 11.

In a state in which the testing socket 10 is mounted on the test board 30, each of the conductive portions 13 is in contact with the pad 31 of the test board 30. Thereafter, as illustrated in FIG. 1B, when the device to be tested 20 is lowered, the leads 21 of the device to be tested 20 come into contact with the respective conductive portions 13 and press the conductive portions 13. Accordingly the conductive particles 12 in the conductive portion 13 get in close contact with each other to form a state which allows current pass. Thereafter, when a predetermined test signal is applied from the test board 30, the test signal is transmitted to the device to be tested 20 via the testing socket 10, and on the other way, a reflected signal from the device to be tested 20 is transmitted to the test board 30 via the testing socket 10.

When pressed in the thickness direction, the testing sockets exhibit conductivity only in the thickness direction. Further, the testing sockets have excellent durability and achieve an electrical connection in a simple way because they do not use a mechanical means such as soldering or springs.

Also, the testing sockets can be connected smoothly because they may absorb mechanical shock or deformation. This allows testing sockets to be widely used for an electrical connection with various test boards such as electric circuit devices.

However, the testing socket according to prior art has the following problems.

First, when the conductive particles are spherical, there is a problem that it is difficult to make a stable electrical connection, because adjacent spherical particles are in contact with each other by point contact. In general, an electrical connection is easily made when the contact area is broad. However, as for contact between spherical particles, only point contact is possible, which makes the contact area small. Accordingly, resistance increases, loss increases, and accordingly it is difficult to make a stable connection.

In addition, when the conductive particles are spherical, in case the conductive particles are repeatedly pressed due to the limitation in compression range, there is a concern that the conductive particles may be easily separated from the elastic material. In other words, in case the electrode of the device to be tested is repeatedly in contact with the conductive particles in the vertical direction for more than tens of thousands of times, there is a problem that the contact force between the elastic material and the conductive particles may be weakened or the elastic material may be torn. In case the conductive particles are separated from the elastic material as above, the feature transmitting the electric flow is lost, and thus the electrical connection between the electrode and the pad is degraded or lost. In particular, as for spherical particles, the contact area with the adjacent elastic material gets small, and this problem becomes significant.

Also, in the case of a conventional conductive particle that is spherical, after being pressed repeatedly for a long period of time, non-uniform operation occurs between many conductive portions depending on contact states between a subject to be tested and the conductive portions and distribution positions of the conductive portions, and accordingly, it is highly likely that resistance deviation occurs between the conductive portions. Specifically, when a testing socket is in contact with a device to be tested, the surface that is under compression is reduced, whereas other outer surfaces are expanded according to the characteristics of an elastic material, like a balloon effect. At this time, the conductive portions in the testing socket are also changed in the compression or expansion direction of the testing socket, depending on positions. Accordingly, the conductive particles of each conductive portion are also moved according to elasticity change in the testing socket, and thus the shape of each conductive portion is changed differently depending on positions. In the case of a conductive particle that is spherical, the height of the conductive portion is limited due to an increase in resistance, and accordingly upon compression, the volume of the testing socket is greatly changed. After being pressed repeatedly for a long period of time, the shape of the conductive portion is highly likely to be changed, and accordingly, non-uniform operation between a plurality of conductive portions resulting therefrom causes resistance deviation.

PRIOR ART DOCUMENT

Korean Patent No. 10-1782604 (Sep. 21, 2017)

SUMMARY OF INVENTION

Technical Task

The present invention is to solve the problems of the prior art. It is an object of the present invention to provide a conductive particle used for a testing socket electrically connecting a lead of a device to be tested and a pad of a test board by being arranged between the device to be tested and the test board, and a testing socket having the same.

Means for Solving the Task

In order to achieve the above object, the present invention provides a conductive particle used for a testing socket electrically connecting a lead of a device to be tested and a pad of a test board by being arranged between the device to be tested and the test board, wherein the conductive particle has a predetermined depth d and has a length l that is greater than a width w, the conductive particle comprising a body part in a pillar shape, a first convex part having an upper surface, formed in a top of the body part, and a second convex part having a lower surface, formed in a bottom of the body part.

According to an embodiment of the present invention, the conductive particle may form a conductive column which stands in the vertical direction and extends in one direction when arranged in an elastic insulating material by a magnetic field.

According to an embodiment of the present invention, upon compression, a lower surface of a second convex part of an upper conductive particle and an upper surface of a first convex part of a lower conductive particle may rotate while maintaining surface contact.

According to an embodiment of the present invention, a length ratio of a width w and a length l of the conductive particle, R1=l/w, may be greater than or equal to 1.2 and less than or equal to 2.5

According to an embodiment of the present invention, a length ratio of a width w and a depth d of the conductive particle, R2=w/d, may be greater than or equal to 1.1 and less than or equal to 5.0.

According to an embodiment of the present invention, the first convex part and the second convex part may be symmetric with respect to the body part.

According to an embodiment of the present invention, the conductive particle may be bilaterally symmetric with respect to a longitudinal central axis.

According to an embodiment of the present invention, a widest width L2 of the first convex part may be greater than a width L1 of the body part.

According to an embodiment of the present invention, a widest width L3 of the second convex part may be greater than a width L1 of the body part.

According to an embodiment of the present invention, at least one of the first convex part and the second convex part may have a semicircle shape.

According to an embodiment of the present invention, at least one of the first convex part and the second convex part may have a triangle shape, and each vertex may be formed to be rounded.

According to an embodiment of the present invention, at least one of the first convex part and the second convex part may have a trapezoid shape, and each vertex may be formed to be rounded.

According to an embodiment of the present invention, at least one of the first convex part and the second convex part may have a square shape, and each vertex may be formed to be rounded.

According to an embodiment of the present invention, a side surface of the body part may be curved inwardly from an upper portion to a center.

According to an embodiment of the present invention, a plurality of bumps may be formed in a side surface of the body part.

Also, in order to achieve the above object, an aspect of the present invention provides a testing socket comprising a plurality of conductive portions being arranged to be spaced apart from each other in the planar direction, in which a plurality of conductive particles are arranged in an elastic insulating material in the thickness direction, and an insulating support supporting each conductive portion and blocking an electrical connection between adjacent conductive portions, wherein the conductive particle is formed in a block shape having a predetermined depth d.

According to an embodiment of the present invention, the conductive particle may comprise a body part in a pillar shape, a first convex part having a smooth upper surface with no projections and grooves, formed in a top of the body part, and a second convex part having a smooth lower surface with no projections and grooves, formed in a bottom of the body part.

According to an embodiment of the present invention, a length ratio of a width w and a length l of the conductive particle, R1=l/w, may be greater than or equal to 1.2 and less than or equal to 2.5.

According to an embodiment of the present invention, a length ratio of a width w and a depth d of the conductive particle, R2=w/d, may be greater than or equal to 1.1 and less than or equal to 5.0.

According to an embodiment of the present invention, the first convex part and the second convex part may be symmetric with respect to the body part.

According to an embodiment of the present invention, a widest width L2 of the first convex part may be greater than a width L1 of the body part.

According to an embodiment of the present invention, a widest width L3 of the second convex part may be greater than a width L1 of the body part.

According to an embodiment of the present invention, at least one of the first convex part and the second convex part may have a semicircle shape.

According to an embodiment of the present invention, at least one of the first convex part and the second convex part may have a triangle shape, and each vertex may be formed to be rounded.

According to an embodiment of the present invention, at least one of the first convex part and the second convex part may have a trapezoid shape, and each vertex may be formed to be rounded.

According to an embodiment of the present invention, at least one of the first convex part and the second convex part may have a square shape, and each vertex may be formed to be rounded.

According to an embodiment of the present invention, the conductive particle may form a conductive column which stands in the vertical direction and extends in one direction when arranged in an elastic insulating material by a magnetic field.

According to an embodiment of the present invention, a first convex part of one conductive particle may be coupled to a second convex part of another conductive particle by any one contact of point contact, line contact and surface contact.

According to an embodiment of the present invention, a side surface of the body part may be curved inwardly from an upper portion to a center.

According to an embodiment of the present invention, a plurality of bumps may be formed in a side surface of the body part.

Effect of invention

According to an aspect of the present invention, when conductive particles are formed in a block shape and are arranged in the vertical direction, the rigidity of a conductive portion may be improved.

Also, as the conductive portion may be lengthened, an amount of compression deformation of the testing socket may increase. Accordingly, the total resistance would decrease, and thus the electrical performance of the testing socket may increase.

Also, when the conductive portion is lengthened, the total volume of the testing socket may increase. Accordingly, deformation is reduced under a same pressure, and uniformity in operation between the conductive portions may be improved.

The effects of the present invention are not limited to the above-mentioned effects, and it should be understood that the effects of the present disclosure include all effects that could be inferred from the configuration of the invention described in the detailed description of the invention or the appended claims.

BRIEF DESCRIPTION OF DRAWINGS

FIGS. 1A-1B are drawings illustrating contact between a lead of a device to be tested and a conductive portion according to prior art;

DETAILED MEANS FOR CARRYING OUT THE INVENTION

Figure 2:
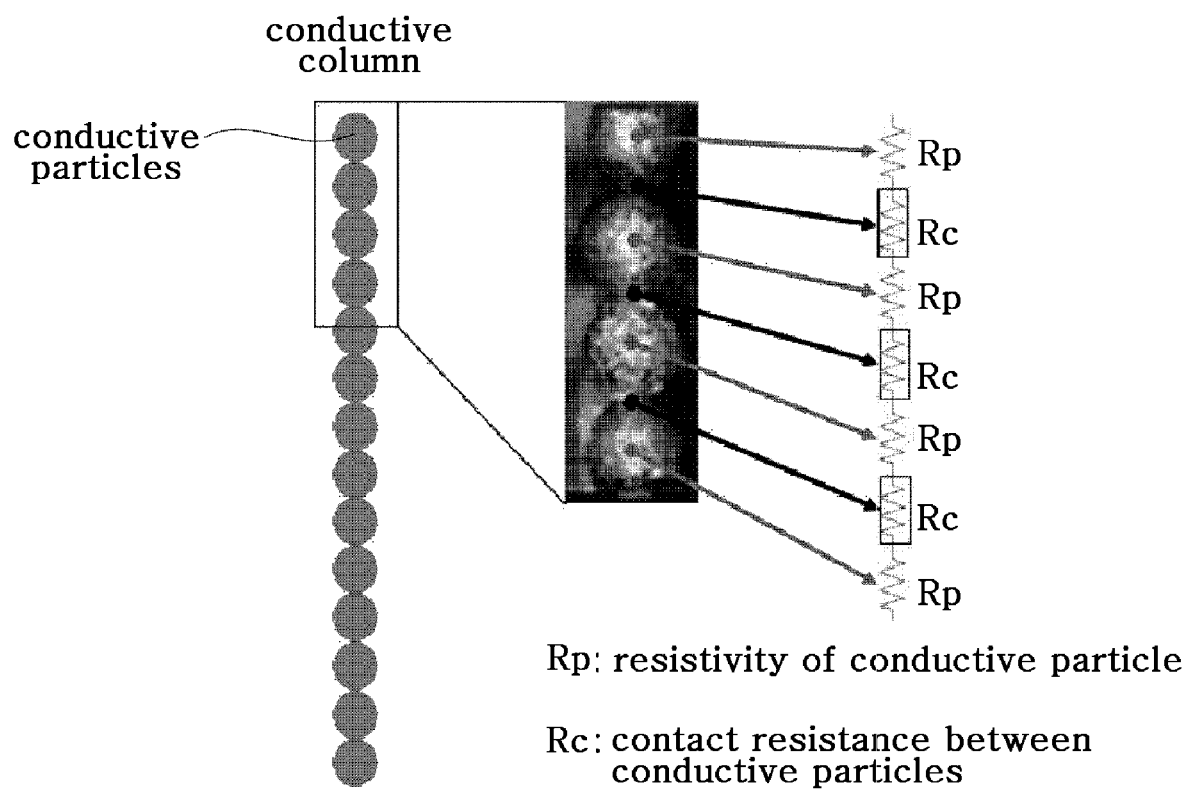
FIG. 2 is a schematic drawing illustrating how the resistance of a conductive portion is determined.

Hereinafter, the present invention will be explained with reference to the accompanying drawings. The present invention, however, may be modified in various different ways, and should not be construed as limited to the embodiments set forth herein. Also, in order to clearly explain the present invention in the drawings, portions that are not related to the present invention are omitted, and like reference numerals are used to refer to like elements throughout the specification.

Throughout the specification, it will be understood that when a portion is referred to as being "connected" to another portion, it can be "directly connected to" the other portion, or "indirectly connected to" the other portion having intervening portions present. Also, when a component "includes" an element, unless there is another opposite description thereto, it should be understood that the component does not exclude another element but may further include another element.

Hereinafter, examples of the present invention will be explained in more detail with reference to the accompanying drawings.

Figure 3:
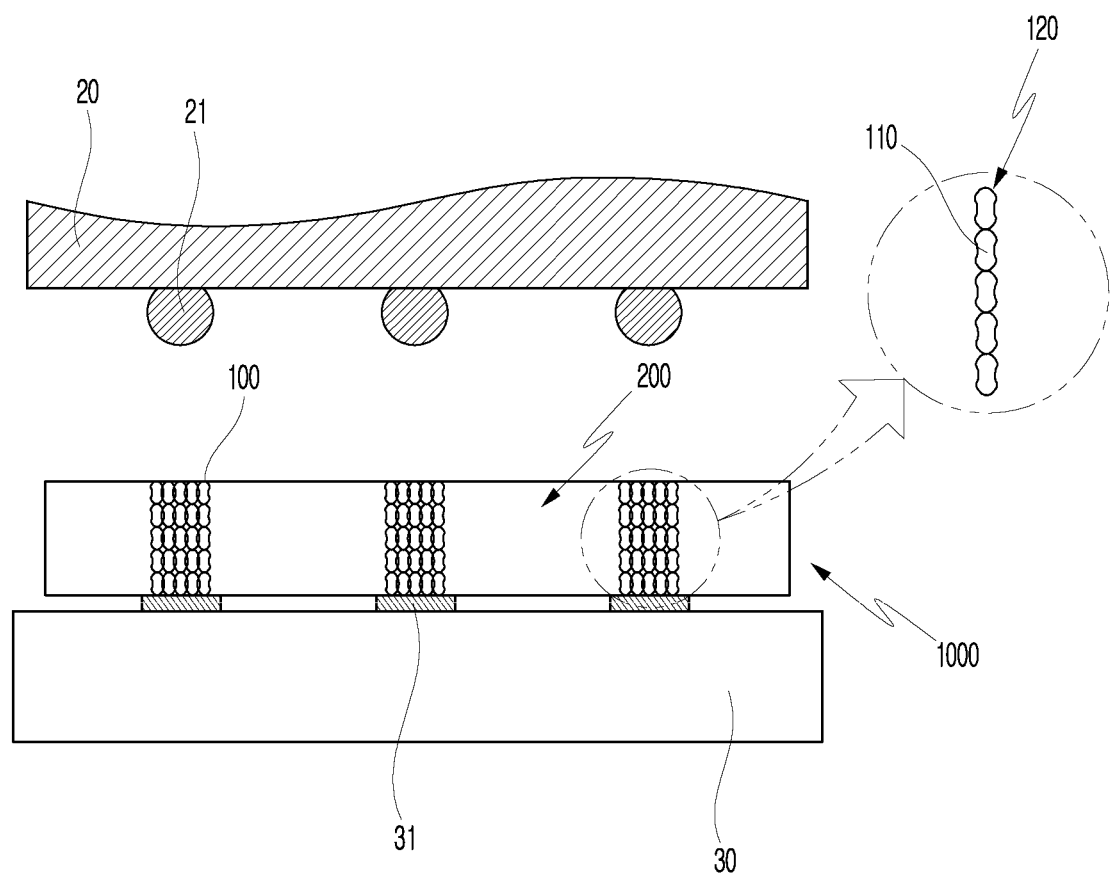
FIG. 3 is a drawing illustrating the testing socket according to an embodiment of the present invention.
Figure 4:
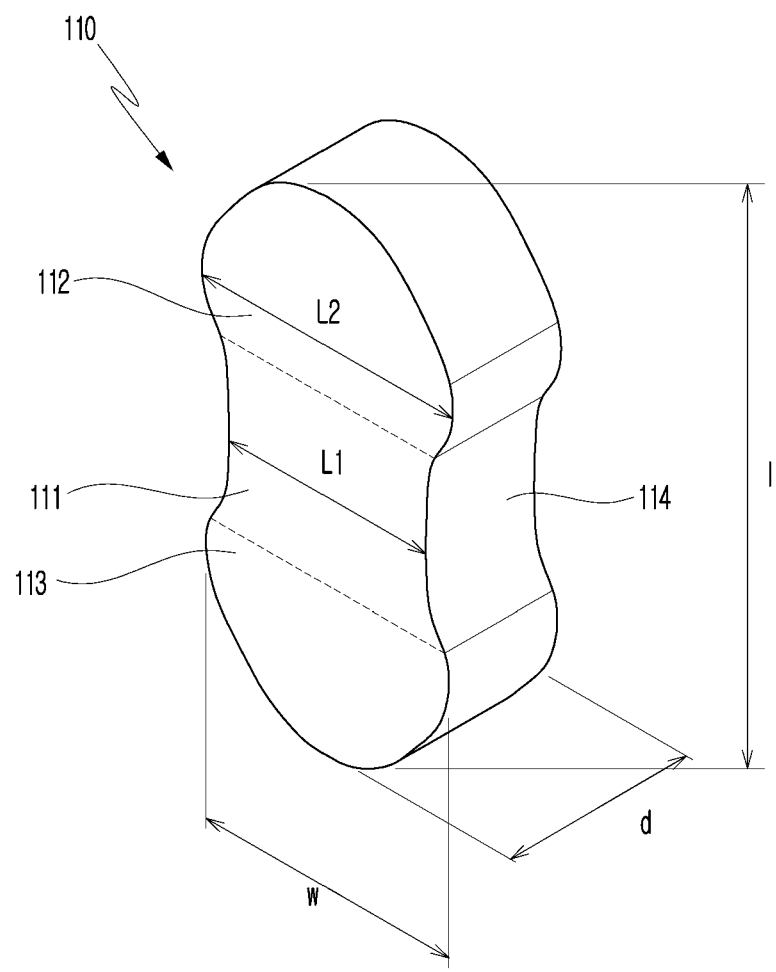
FIG. 4 is a perspective view of the conductive particle according to an embodiment of the present invention.
Figure 5A:
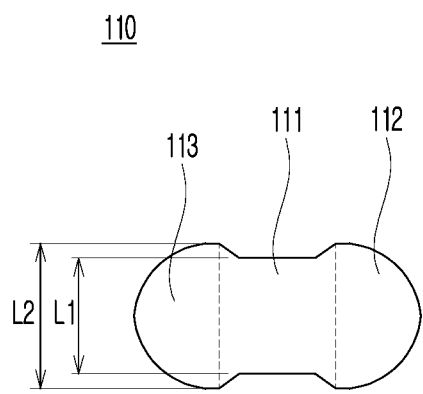
FIGS. 5A-5F are drawings showing various embodiments of the conductive particle of the present invention.
Figure 5B:
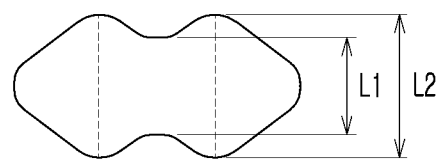
Figure 5C:
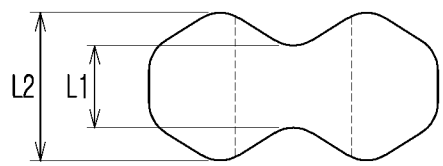
Figure 5D:
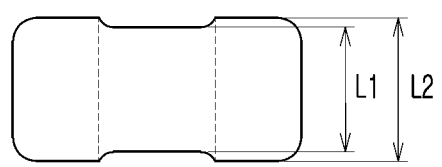
Figure 5E:
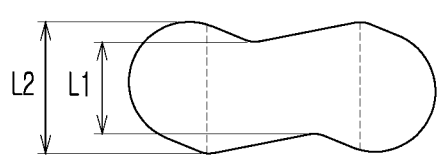
Figure 5F:
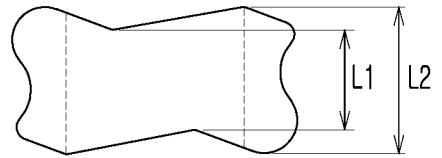
Figure 6A:
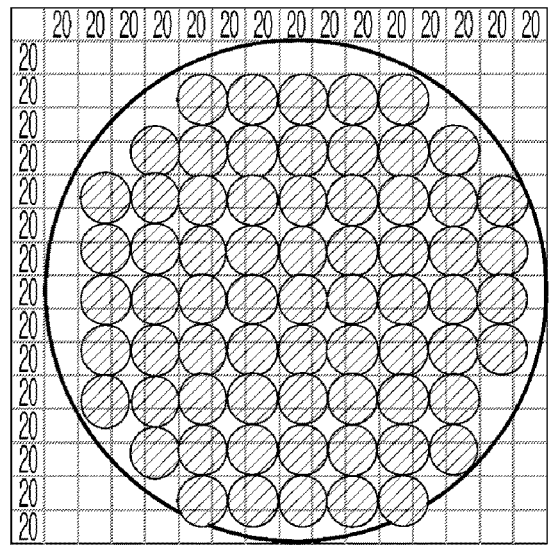
FIGS. 6A-6B are drawings illustrating the comparison between the conventional conductive particle and the conductive particle of the present invention.
Figure 6A:
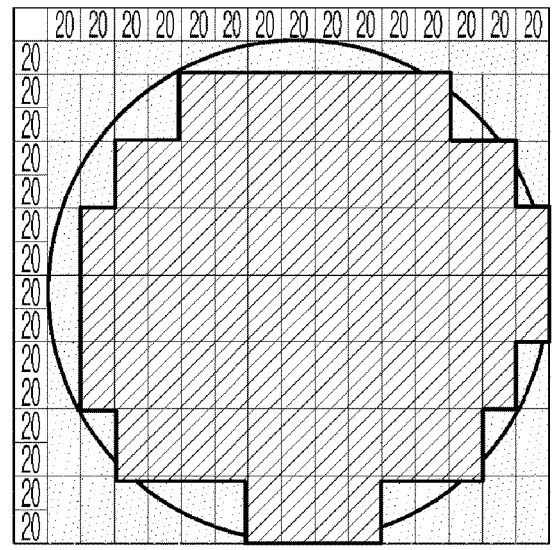
Figure 6B:
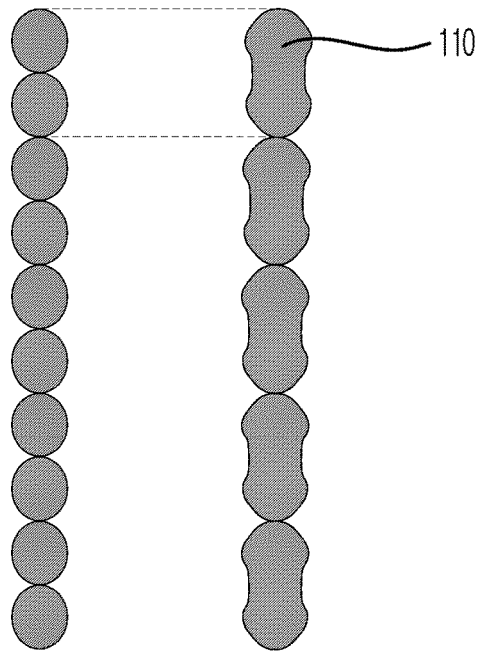

FIG. 2 is a schematic drawing illustrating how the resistance of a conductive portion is determined, FIG. 3 is a drawing illustrating the testing socket according to an embodiment of the present invention, FIG. 4 is a perspective view of the conductive particle according to an embodiment of the present invention, FIGS. 5A-5F are drawings showing various embodiments of the conductive particle of the present invention, and FIGS. 6A-6B are drawings illustrating the comparison between the conventional conductive particle and the conductive particle of the present invention.

In this regard, a schematic method for determining the resistance of the conductive portion will be described with reference to FIG. 2 as follows.

First, when the individual resistivity of the conductive particles 110 is denoted by $R_P$ and the contact resistance between the conductive particles 110 is denoted by $R_C$, the resistance $R_L$ of the conductive column 120 formed by arranging the conductive particles 110 in the vertical direction is $R_L = \Sigma R_P + \Sigma R_C$ since the respective resistances are connected in series.

At this time, $R_L \approx R_C$ since the contact resistance $R_C$ between the conductive particles 110 is relatively greater than the individual resistivity $R_P$ of the conductive particles 110. Further, the total resistance $R_{total}$ of the conductive portion is $R_{total} \approx \Sigma R_C/N$ since N conductive columns 120 are connected in parallel.

In other words, when the size and material of the conductive particles 110 are the same, the resistance of the conductive portion 100 is determined by the number of conductive columns 120 and the number of conductive particles 110 that form a conductive column 120. The larger the number of conductive columns 120 and the smaller the number of conductive particles 110 that form the conductive column 120, a lower resistance is formed in the conductive portion 100.

However, as a lead 21 of a device to be tested 20 such as a semiconductor device gets smaller in size, the diameter of the conductive portion 100 also gets smaller, and accordingly, the number of conductive columns 120 is reduced.

Also, when the number of conductive particles 110 in a conductive columns 120 is reduced in consideration of resistance, the elastic region is reduced, and accordingly resistance deviation between the conductive portions 100 gets larger due to uneven contact pressure between each conductive portion 100 and the lead 21 of the device to be tested 20.

As illustrated in FIG. 3, a testing socket 1000 of the present invention comprises a conductive portion 100 and an insulating support 200.

The testing socket 1000 may be in the form of a sheet having a predetermined thickness. At this time, the testing socket 1000 is configured to enable an electrical flow only in the thickness direction, not in the planar direction, thereby electrically connecting the lead 21 of the device to be tested 20 and the pad 31 of the test board 30 in the vertical direction.

Such testing socket 1000 is used to carry out electrical testing of the device to be tested 20, thereby determining whether the device to be tested 20 that is manufactured is defective.

The insulating support 200 forms the body of the testing socket 1000, to support the conductive portion 100 when each conductive portion 100 is under contact load, and block an electrical connection between adjacent conductive portions 100.

More specifically, the insulating support 200 protects each conductive portion 100 by absorbing the contact force when coming into contact with the lead 21 of the device to be tested 20 such as a semiconductor device or the pad 31 of the test board 30.

Preferably, the insulating support 200 is made of an insulating polymer material having a crosslinked structure. More specifically, as the insulating polymer material, conjugated diene rubbers such as polybutadiene rubber, natural rubber, polyisoprene rubber, styrene-butadiene copolymer rubber, acrylonitrile-butadiene copolymer rubber and hydrogenated additives thereof, block copolymer rubbers such as styrene-butadiene-diene block copolymer rubber, styrene-isoprene block copolymer and hydrogenated additives thereof, chloroprene, urethane rubber, polyester rubber, epichlorohydrin rubber, silicone rubber, ethylene-propylene copolymer rubber, ethylene-propylene-diene copolymer rubber, etc. may be used. In particular, it is preferable to use silicone rubber in view of molding processability and electrical properties.

As such silicone rubber, preferably, a liquid silicone rubber is crosslinked or condensed. Preferably, the viscosity of the liquid silicone rubber is greater than or equal to $10^{-1}$ pores and less than or equal to $10^5$ pores in terms of shear rate, and the silicone rubber may be any one of a condensation type, an addition type, or a type containing a vinyl group and a hydroxyl group. Specifically, the silicone rubber may be dimethyl silicone raw rubber, methyl vinyl silicone raw rubber, methylphenyl vinyl silicone raw rubber, etc.

The conductive portion 100 extends in the thickness direction and is compressed when pressed in the thickness direction to enable an electrical flow in the thickness direction, and each conductive portion 100 is arranged to be spaced apart from each other in the planar direction. An insulating support 200 having an insulating property is arranged between the conductive portions 100 to cut off the electrical flow between the conductive portions 100.

The conductive portion 100 is configured such that its upper end can contact the lead 21 of the device to be tested 20 and its lower end can contact the pad 31 of the test board 30. A plurality of conductive particles 110 are formed between the upper and lower ends of the conductive portion 100 so that the conductive particles are oriented vertically in the elastic insulating material. When the conductive portion 100 is pressed by the device to be tested 20, the plurality of conductive particles 110 contact each other and carry out the role enabling an electrical connection.

That is, before being pressed by the device to be tested 20, the conductive particles 110 are slightly spaced apart or in weak contact, and when the conductive portion 100 is pressed and compressed, the conductive particles 110 strongly contact each other, thereby enabling an electrical connection.

Specifically, the conductive portion 100 has a form in which a plurality of conductive particles 110 are densely arranged in an elastic insulating material in the vertical direction, and each conductive portion 100 is arranged in a position approximately corresponding to the lead 21 of the device to be tested 20.

At this time, when a magnetic force line acts on the conductive portion 100, each conductive particle 110 is arranged in the elastic insulating material by a magnetic field, and forms a conductive column 120 extending in the vertical direction. That is, the conductive portion 100 is configured to have a structure in which a plurality of conductive columns 120 are arranged in parallel.

As conductive particles, particles 110 made of metals exhibiting magnetism such as nickel, iron, cobalt, particles made of alloys thereof, particles containing these metals, or a plating of conductive metal which cannot be oxidized easily such as gold, silver, palladium, rhodium on the surface of the corresponding core particles using these particles as core particles, may be used.

As described above, with regard to the device to be tested 20 such as a semiconductor device, technology development is ongoing in a direction to increase the number of leads 21 and decrease the pitch between the leads 21, and accordingly, the testing socket 1000 is also being manufactured to correspond to this direction of technology development. However, with regard to the testing socket 1000, as the pitch of the lead 21 decreases, the diameter of the conductive portion 100 gets smaller, thereby causing the conductive particles to be smaller. When the conductive particles get smaller, the column of the conductive portion 100 also gets smaller, thereby reducing the elastic section for pressure when contacting the device to be tested 20, which facilitates damage and shortens the lifespan due to non-uniform resistance between the conductive portions 100. In addition, as the diameter of the conductive portion 100 gets smaller, the number of conductive columns 120 decreases, thereby degrading electrical performance such as increasing resistance and decreasing allowable current.

According to an embodiment, as illustrated in FIG. 4, the conductive particle 110 of the present invention may be formed to have a block shape, and more specifically, to have a block shape with a predetermined depth d and a length l that is greater than a width w.

More specifically, a length ratio of a width w and a length l of the conductive particle 110 of the present invention, R1=l/w, may be greater than or equal to 1.2 and less than or equal to 2.5. The conductive particle 110 of the present invention has a length ratio of about 2 times, such that the conductive column 120 can be lengthened by about 30% to 50% or more, and also the number of conductive particles 110 in a conductive column 120 can be reduced, thereby maintaining a lower resistance. That is, the conductive particle 110 of the present invention allows the performance of the conductive portion 100 to be improved within the aforementioned range R1, while maintaining the electrical characteristics of the conductive portion 100, thereby extending the lifespan of the testing socket 1000. When R1 is less than 1.2, the resistance improvement effect which reduces the resistance of the conductive column 120 decreases. When R1 is more than 2.5, the conductive particles 110 are highly likely to be separated from each other upon compression.

Also, a length ratio of a width w and a depth d of the conductive particle 110, R2=w/d, may be greater than or equal to 1.1 and less than or equal to 5.0. In this case, the conductive particles 110 may be easily arranged in a specific direction by a magnetic field. That is, the conductive particles 110 do not rotate randomly with respect to the longitudinal central axis, but are arranged in a specific direction so as to make line or surface contact between upper and lower conductive particles 110 more easily. When R2 is less than 1.1, each conductive particle 110 rotates individually, and thus it may be difficult to arrange the conductive particles 110 in a specific direction. When R2 is more than 5.0, the conductive particle 110 is formed approximately in a plate shape, and thus when the conductive particles 110 stand in the thickness direction, the conductive portion 100 may not be rigid.

According to an embodiment, the conductive particle 110 may comprise a body part 111 in a pillar shape, a first convex part 112 formed in a top of the body part 111, and a second convex part 113 formed in a bottom of the body part 111.

The body part 111 may be approximately in a pillar shape and more specifically in a square pillar shape with a predetermined thickness, but is not limited thereto and may be in various polygonal pillars.

Preferably, the body part 111 has a shape and size allowing each conductive portion 100 to stand in the thickness direction when the conductive particles are arranged in an elastic material by a magnetic field, and has a pillar shape extending in one direction.

The first convex part 112, which is formed in a top of the body part 111, may have an upper surface smoothly connected without having projections and grooves. Likewise, the second convex part 113, which is formed in a bottom of the body part 111, may have a lower surface smoothly connected without having projections and grooves.

In the case of conductive particles having a shape with projections and grooves in the top and bottom, the conductive particles are coupled to each other by a concavo-convex structure. At this time, when a magnetic force line acts thereon, the projections are more likely to be coupled to each other, rather than being coupled to the grooves, because the projection sites have a stronger intensity. Further, due to unsmooth surfaces, it is highly likely that as the pressure increases, the adhesion between the insulating support and the conductive particles is separated, which results in degradation of durability.

In the case of the conductive particle 110 of the present invention, the first convex part 112 and the second convex part 113 have surfaces smoothly connected without having projections and grooves, so that the conductive particles 110 can be stably connected with each other by surface contact and can easily rotate. Also, the conductive particles are unlikely to be separated from the insulating support 200 even when a higher pressure is applied thereto, thereby improving durability.

Meanwhile, the conductive particle 110 of the present invention may be bilaterally symmetric with respect to a longitudinal central axis, and the first convex part 112 and the second convex part 113 may be symmetric with respect to the body part 111. When compressed by the device to be tested 20, each of the conductive particles 110 that form the conductive portion 100 may have a uniform motion. Accordingly, uniformity in operation between the conductive portions 100 is improved, thereby maintaining uniform quality of the testing socket 1000.

According to an embodiment, a widest width L2 of the first convex part 112 may be greater than a width L1 of the body part 111. Likewise, a widest width L3 of the second convex part 113 may be greater than a width L1 of the body part. Further, a side surface 114 of the body part 111 may be curved inwardly from an upper portion to a center. Accordingly, a space may be formed between one conductive particle 110 and other conductive particles 110 adjacent to the side thereof, and the space may be filled with an elastic insulating material to minimize separation of the conductive particles 110 from the conductive portion 100. That is, the rigidity of the conductive portion 100 can be improved.

Meanwhile, a plurality of bumps may be prepared on the side surface 114 of the conductive particle 110. When the plurality of bumps are prepared on the side surface 114, an elastic insulating material is filled in a gap between the bumps to ensure the prevention of separation of the conductive particles.

Various embodiments of a conductive particle 110 of the present invention are described with reference to FIGS. 5A-5F. At least one of the first convex part 112 and the second convex part 113 may be formed in any one of a semicircle shape, a triangle shape, a square shape and a trapezoid shape. At this time, each vertex may be smoothly rounded. The first convex part 112 and the second convex part 113 are formed to be smoothly connected without having projections and grooves, so that the conductive particles 110 can be stably connected with each other by surface contact and can easily rotate. Also, the conductive particles are unlikely to be separated from the insulating support 200 even when a higher pressure is applied thereto, since the surface area of the conductive particles increases, thereby improving durability. The shape of the first convex part 112 and the second convex part 113 is not limited thereto, but the first convex part and the second convex part may be formed in any shape as long as no projections and grooves are formed thereon.

Upon comparing spherical conductive particles with block-shaped conductive particles of the present invention which have a similar cross-sectional area with reference to FIG. 6A, in the case of the conductive particles 110 of the present invention, the number of conductive columns 120 is increased by about 1.1 to 1.2 times greater than that of the spherical conductive particles.

Also, with reference to FIG. 6B, when the length of the block-shaped conductive particle of the present invention is 2 times longer than that of the spherical conductive particle, the contact site between the conductive particles 110 is almost half as small as that between the spherical conductive particles at the same height. Accordingly, the resistance of the conductive column 120 is about ½.

The total resistance of the conductive portion 100 formed with the block-shaped conductive particles 110 according to the present invention is significantly reduced compared with the resistance of the conductive portion formed with the spherical conductive particles, thereby improving electrical performance of the testing socket 1000.

Figures 7A, 7B:
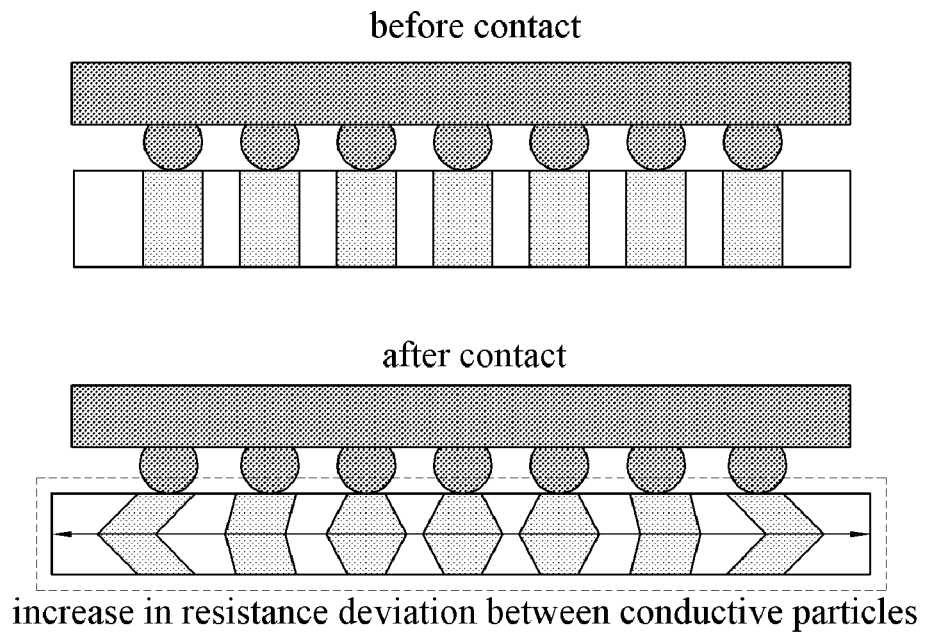
FIGS. 7A and 7B show schematic views illustrating a change of the testing socket occurring when the device to be tested presses the testing socket, and tables of comparison of a volume change of the testing socket depending on volumes upon pressurization, respectively.

FIG. 7A is a schematic view illustrating a change of a testing socket occurring when a device to be tested presses the testing socket, and FIG. 7B shows tables of comparison of a volume change of the testing socket depending on volumes upon pressurization.

As illustrated in FIG. 7A, when the testing socket 1000 is pressed by the device to be tested 20 from the top, the surface that is under compression is reduced, whereas other outer surfaces are expanded according to the characteristics of elastic material. At this time, the conductive portions 100 in the testing socket 1000 are also changed in the compression or expansion direction, depending on positions. Accordingly, the conductive particles 110 of each conductive portion 100 also move according to elasticity change in the testing socket, and thus the shapes of the conductive portions 100 are changed differently depending on positions.

There is no significant difference in quality between the conductive portions 100 at an initial stage, but resistance deviation occurs due to difference in operation between the conductive portions 100 after repeated contacts for a long period of time. As the conductive portions 100 are greatly changed, the conductive column 120 is damaged. Accordingly, the lifespan of the testing socket 1000 is shortened.

Upon comparing a testing socket with a width of 9 mm, a length of 9 mm and a height of 1 mm with a testing socket with a width of 9 mm, a length of 9 mm and a height of 1.5 mm with reference to FIG. 7B, the testing socket with a height of 1.5 mm has a smaller volume change when each of the testing sockets is pressed with the same stroke of 0.2 mm. As such, the testing socket with a height of 1.5 mm has a lower possibility of damage on the conductive column, and the lifespan thereof increases. Meanwhile, if a height is lengthened, the total volume increases and a volume change may decrease, whereas the number of conductive particles in a conductive column increases and the resistance increases.

Figures 8A, 8B:
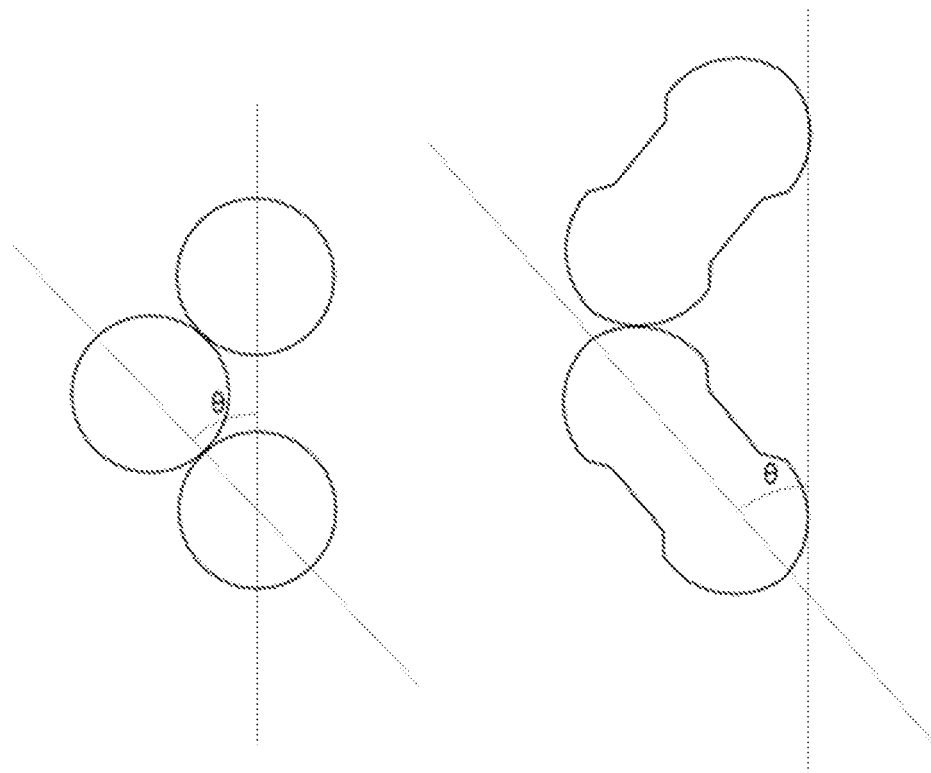
FIGS. 8A and 8B show drawings illustrating the comparison of operation between the conductive column formed with the conventional conductive particles and the conductive column formed with the conductive particles of the present invention upon compression, and a table of comparison of operation between the conductive column formed with the conventional conductive particles and the conductive column formed with the conductive particles of the present invention, respectively.

FIG. 8A is a drawing illustrating the comparison of operation between a conductive column formed with conventional conductive particles and a conductive column formed with conductive particles of the present invention upon compression, and FIG. 8B shows a table of comparison of operation between the conductive column formed with the conventional conductive particles and the conductive column formed with the conductive particles of the present invention.

With reference to FIG. 8A, a threshold value of displacement angle θ between conductive particles 110 in a conductive column 120 is generally about 45° upon compression of a testing socket 1000. When the displacement angle θ exceeds the threshold value, the adhesion between the insulating support 200 and the conductive particles 110 is separated, and the conductive column 120 collapses. That is, the resistance of the conductive portion 100 increases.

Upon comparing a conventional testing socket having spherical conductive particles with a testing socket having block-shaped conductive particles of the present invention with reference to FIG. 8A and FIG. 8B, the testing socket 1000 of the present invention may have 15 conductive particles 110 in one conductive column 120, which is smaller in number than 20 conductive particles in one conductive column of the conventional testing socket, while having a thickness about 2 times greater than the conventional testing socket.

Also, the displacement angle θ of the conductive particles is 38.92° upon pressurization with the same stroke of 0.2 mm, which is smaller than 42.54° of that of the conventional testing socket. Accordingly, the testing socket 1000 of the present invention may increase an amount of compression displacement to be larger than the conventional testing socket having the spherical conductive particles, and when the amount of compression displacement increases, the compression pressure decreases at the same stroke. Accordingly, the fatigue life of the testing socket 1000 increases, thereby improving durability.

The foregoing description of the present invention has been presented for illustrative purposes, and it is apparent to a person having ordinary skill in the art that the present invention can be easily modified into other detailed forms without changing the technical idea or essential features of the present invention. Therefore, it should be understood that the forgoing embodiments are by way of example only, and are not intended to limit the present disclosure. For example, each component which has been described as a unitary part can be implemented as distributed parts. Likewise, each component which has been described as distributed parts can also be implemented as a combined part.

The scope of the present invention is presented by the accompanying claims, and it should be understood that all changes or m modifications derived from the definitions and scopes of the claims and their equivalents fall within the scope of the present invention.

| Description of reference numerals |
|---|
| 1000: testing socket |
| 100: conductive portion |
| 110: conductive particle |
| 111: body part |
| 112: first convex part |
| 113: second convex part |
| 114: side surface of body part |
| 120: conductive column |
| 200: insulating support |
| 20: device to be tested |
| 21: lead |
| 30: test board |
| $R_p$: resistivity of conductive particle |
| $R_c$: contact resistance between conductive particles |
| $R_L$: resistance of conductive column |
| $R_{total}$: total resistance of conductive part |

What is claimed is:

1. A conductive particle used for a testing socket electrically connecting a lead of a device to be tested and a pad of a test board, and arranged between the device and the test board, wherein the conductive particle has a block shape having a depth (d) and having a length (l) in a longitudinal direction that is greater than a width (w) in a lateral direction, the conductive particle comprising:
a body part in a pillar shape;
a first convex part having an upper surface and disposed on a top of the body part; and
a second convex part having a lower surface in and disposed on a bottom of the body part,
wherein a widest width (L2) of the first convex part is greater than a widest width (L1) of the body part, and a widest width (L3) of the second convex part is greater than the widest width (L1) of the body part, and
wherein the first convex part has the widest width (L2) between two opposite points at side surfaces thereof and the upper surface of the first convex part continuously extends from the two opposite points at the side surfaces thereof to a top center point of the upper surface, the upper surface forming a substantial semicircular shape, and the second convex part has the widest width (L3) between two opposite points at side surfaces thereof and the lower surface of the second convex part continuously extends from the two opposite points at the side surfaces thereof to a bottom center point of the lower surface, the lower surface forming a substantial semicircular shape, such that upon pressurization of the pad, an adjacent conductive particle arranged in a vertical direction of the conductive particle slidingly rotates along the first convex part or the second convex part of the conductive particle.

2. The conductive particle of claim 1, wherein the conductive particle, in association with the adjacent conductive particle, forms a conductive column which stands in the vertical direction and extends in one direction when arranged in an elastic insulating material by a magnetic field.

3. The conductive particle of claim 2, wherein upon compression of the conductive particle against the adjacent conductive particle, the adjacent conductive particle rotates with respect to the conductive particle while maintaining surface contact with each other.

4. The conductive particle of claim 1, wherein a length ratio of the width (w) and the length (l) of the conductive particle, R1=l/w, is greater than or equal to 1.2 and less than or equal to 2.5.

5. The conductive particle of claim 1, wherein a length ratio of the width (w) and the depth (d) of the conductive particle, R2=w/d, is greater than or equal to 1.1 and less than or equal to 5.0.

6. The conductive particle of claim 1, wherein the first convex part and the second convex part are symmetric with respect to the body part.

7. The conductive particle of claim 1, wherein the conductive particle is bilaterally symmetric with respect to a longitudinal central axis.

8. The conductive particle of claim 1, wherein at least one of the first convex part and the second convex part has a semicircle shape.

9. The conductive particle of claim 1, wherein at least one of the first convex part and the second convex part has a triangle shape, and each vertex of the triangle shape is formed to be rounded.

10. The conductive particle of claim 1, wherein at least one of the first convex part and the second convex part has a trapezoid shape, and each vertex of the trapezoid shape is formed to be rounded.

11. The conductive particle of claim 1, wherein at least one of the first convex part and the second convex part has a square shape, and each vertex of the square shape is formed to be rounded.

12. The conductive particle of claim 1, wherein a side surface of the body part is curved inwardly from an upper portion to a center thereof.

13. The conductive particle of claim 1, wherein a plurality of bumps are formed on a side surface of the body part.

* * * * *